(12) United States Patent
Iwase et al.

(10) Patent No.: US 7,169,003 B2
(45) Date of Patent: Jan. 30, 2007

(54) METHOD OF MANUFACTURING A DISPLAY UNIT

(75) Inventors: Yuichi Iwase, Kanagawa (JP); Mitsuru Asano, Kanagawa (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/318,371

(22) Filed: Dec. 23, 2005

(65) Prior Publication Data

US 2006/0099873 A1 May 11, 2006

Related U.S. Application Data

(62) Division of application No. 10/787,038, filed on Feb. 24, 2004, now Pat. No. 7,034,457.

(30) Foreign Application Priority Data

Feb. 24, 2003 (JP) .......................... P2003-046318
Jan. 19, 2004 (JP) .......................... P2004-010345

(51) Int. Cl.
*H01J 9/00* (2006.01)

(52) U.S. Cl. ........................................ 445/23

(58) Field of Classification Search ............ 445/23–25; 313/495–497, 491, 493, 505, 512

See application file for complete search history.

(56) References Cited

U.S. PATENT DOCUMENTS

| | | | |
|---|---|---|---|
| 6,198,217 B1 * | 3/2001 | Suzuki et al. ................ | 313/504 |
| 2002/0068143 A1 * | 6/2002 | Silvernail et al. ............. | 428/76 |
| 2003/0117071 A1 * | 6/2003 | Lee et al. .................... | 313/512 |
| 2003/0214232 A1 * | 11/2003 | Guenther et al. ........... | 313/512 |

FOREIGN PATENT DOCUMENTS

| | | |
|---|---|---|
| JP | 2001-094113 | 4/2001 |
| JP | 2002-149112 | 5/2002 |
| JP | 2002-372928 | 12/2002 |
| JP | 2003-022035 | 1/2003 |
| JP | 2003-031363 | 1/2003 |
| JP | 2001-093661 | 9/2006 |

* cited by examiner

*Primary Examiner*—Joseph Williams
(74) *Attorney, Agent, or Firm*—Bell, Boyd & Lloyd LLC

(57) ABSTRACT

A display unit and method of manufacturing same is provided. The display unit includes a drive panel and a sealing panel that face each other with a middle layer in between. The display panel includes a number of light-emitting devices on a drive substrate with a drive device layer and a coating layer that is provided over the drive device layer in between. The middle layer is disposed between the drive panel and the sealing panel so as to be laid over the light-emitting devices.

5 Claims, 12 Drawing Sheets

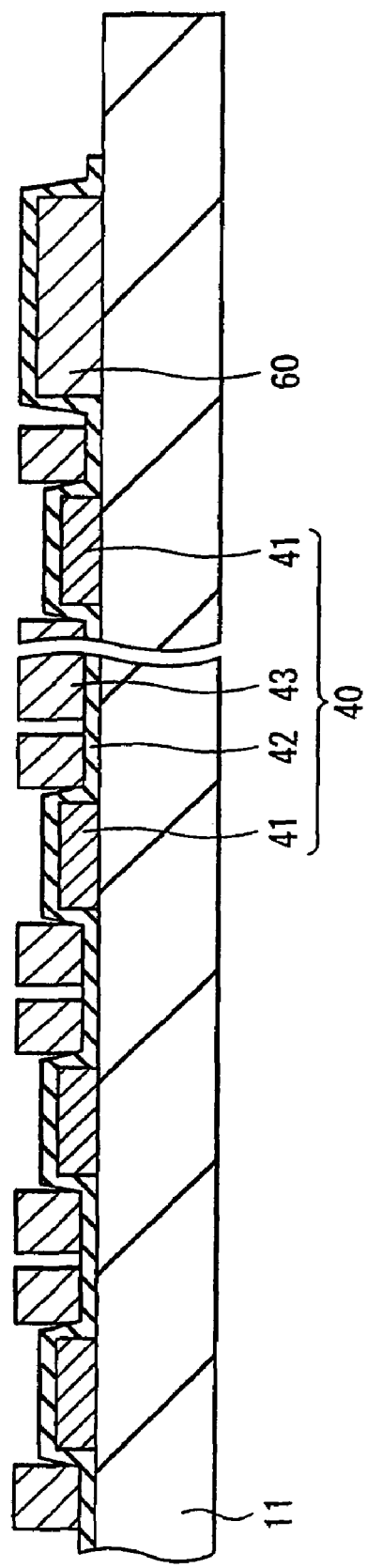

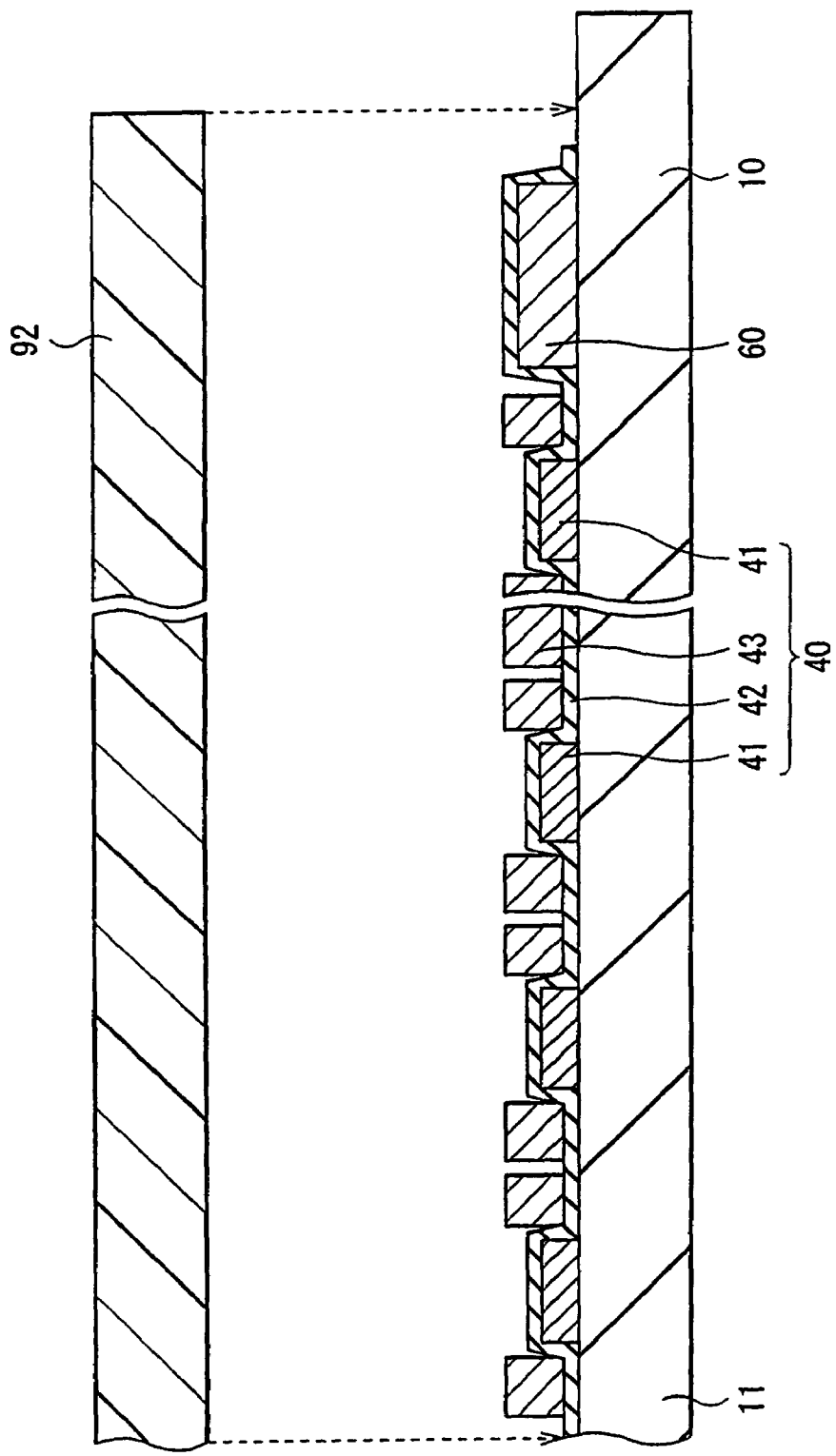

METHOD OF MANUFACTURING A DISPLAY UNIT

CROSS REFERENCE TO RELATED APPLICATIONS

This application is a divisional of, claims the benefit of and priority to U.S. patent application Ser. No. 10/787,038 filed on Feb. 24, 2004 now U.S. Pat. No. 7,034,457, which claims priority to Japanese Patent Document Nos. P2003-046318 filed on Feb. 24, 2003, and P2004-010345 filed on Jan. 19, 2004, the disclosures of which are herein incorporated by reference.

BACKGROUND OF THE INVENTION

The present invention relates to a display unit in which a drive panel including a light-emitting device and a sealing panel face each other with a middle layer in between, and a method of manufacturing the display unit, and more specifically to a display unit suitable for an organic light-emitting display using a top emission organic light-emitting device, and a method of manufacturing the display unit.

In recent years, organic light-emitting displays using an organic light-emitting device as an alternative to liquid crystal displays have become a focus of attention. The organic light-emitting displays are of a self-luminous type, so it is considered that the organic light-emitting displays have advantages of a wide viewing angle, low power consumption and adequate response to high-definition high-speed video signals. Therefore, the organic light-emitting displays have been developed for practical use.

In the organic light-emitting display, for example, a drive device such as a TFT (thin film transistor) is formed on a substrate, and an organic light-emitting device is formed on the drive device with a planarization layer in between. The planarization layer is generally formed only in a display area (Japanese Patent Application Publication No. 2001-102168, fox example). On the other hand, there is such a structure that the planarization layer is extended beyond the display area to an area under a seal for adhering a protective casing to a peripheral portion of the back of the substrate, and the planarization layer is used as a buffer layer to absorb stress generated during curing of the seal (refer to Japanese Patent Application Publication No. 2001-102166, for example).

Moreover, as the material of the planarization layer, for example, a film capable of resisting a temperature for vaporizing moisture such as SOG (spin on glass) is proposed in order to prevent the entry of moisture into the organic light-emitting device (refer to Japanese Patent Application Publication No. 2001-102165, for example). Further, it is reported that a material including an epoxy-containing alkali-soluble resin and a 1,2 quinonediazido compound is used so that a through hole or the like can be formed with high resolution (refer to Japanese Patent Application Publication No. 2002-182380, for example).

In recent years, as an organic light-emitting display with high intensity and high aperture, a display with a top emission and all-solid-state sealing structure in which the whole surfaces of a drive panel and a sealing panel are bonded together with an adhesive layer in between, and light generated in the organic light-emitting device is extracted from the sealing panel has been proposed. Fox example, the drive panel includes a plurality of organic light-emitting devices on a drive substrate with a drive device layer such as a TFT and a coating layer as a planarization layer laid over the drive device layer in between.

However, in such a structure, the coating layer is formed all over a surface of the drive substrate without patterning the coating layer, so an end portion of the coating layer is exposed from an end portion of the adhesive layer. Therefore, external moisture may enter via the coating layer as a path, thereby resulting in degradation of the organic light-emitting devices.

SUMMARY OF THE INVENTION

The present invention generally relates to a display unit. More specifically, the present invention relates to a display unit in which a device panel that includes a light-emitting device and a sealing panel that face each other with a middle layer in between and a method of manufacturing same. In an embodiment, the present invention provides a display unit suitable for an organic light-emitting display that uses a top emission organic light-emitting device and methods of manufacturing same.

In an embodiment, the present invention provides a display unit capable of preventing the entry of moisture via a coating layer and having higher reliability, and a method of manufacturing the display unit.

A display unit according to an embodiment of the present invention includes a drive panel including a plurality of light-emitting devices on a drive substrate with a drive device layer and a coating layer being laid over the drive device layer in between; a sealing panel including a sealing substrate, and facing the drive panel on a side where the light-emitting devices are disposed; and a middle layer being disposed between the drive panel and the sealing panel so as to be laid over the plurality of light-emitting devices, and being laid over a surface and an end surface of the coating layer.

A method of manufacturing a display unit according to an embodiment of the present invention includes forming a plurality of light-emitting devices on a drive substrate with a drive device layer and a coating layer being laid over the drive device layer in between to form a drive panel; forming a middle layer being laid over the plurality of light-emitting devices and a surface and an end surface of the coating layer; and disposing a sealing panel including a sealing substrate on a side of the drive panel where the light-emitting devices are disposed so as to face the drive panel with the middle layer in between.

In the display unit according to an embodiment of the invention, the middle layer is laid over not only the surface but also the end surface of the coating layer, so the end surface of the coating layer is not exposed to outside from between the drive panel and the sealing panel, thereby external moisture can be prevented from entering a light-emitting device portion via the coating layer.

In the method of manufacturing a display unit according to an embodiment of the present invention, a number of light-emitting devices are formed on the drive substrate with the drive device layer and the coating layer being laid over the drive device layer so as to form the drive panel, then, the middle layer being laid over the plurality of light-emitting devices and the surface and the end surface of the coating layer is formed. Next, the sealing panel including the sealing substrate is disposed on a side of the drive panel where the light-emitting devices axe disposed so as to face the drive panel with the middle layer in between.

In an embodiment, a display unit is provided that is capable of preventing the entry of moisture via a coating layer and having higher reliability. A drive panel and a sealing panel face each other with a middle layer in between.

The drive panel includes organic light-emitting devices on a drive substrate with a drive device layer and a coating layer being laid over the drive device layer in between. The middle layer is disposed between the drive panel and the sealing panel so as to be laid over the organic light-emitting devices, and the middle layer is laid over not only a surface but also an end surface of the coating layer, Therefore, the end surface of the coating layer is not exposed froze between the drive panel and the sealing panel, so external moisture can be prevented from entering via the coating layer.

Additional features and advantages of the present invention are described in, and will be apparent from, the following Detailed Description of the Invention and the figures.

BRIEF DESCRIPTION OF THE FIGURES

FIGS. 3A and 3B are sectional views for describing a step of a method of manufacturing the display unit shown in FIGS. 1A and 1B according to an embodiment of the present invention.

FIGS. 8A and 8B are illustrations for describing another method of manufacturing the display unit shown in FIGS. 1A and 1B according to an embodiment of the present invention.

DETAILED DESCRIPTION OF THE INVENTION

The present invention generally relates to a display unit. More specifically, the present invention relates to a display unit in which a device panel that includes a light-emitting device and a sealing panel that face each other with a middle layer in between and a method of manufacturing same. In an embodiment, the present invention provides a display unit suitable for an organic light-emitting display that uses a top emission organic light-emitting device and methods of manufacturing same.

Preferred embodiments of the invention will be described in more detail below referring to the accompanying drawings.

Figure 1:
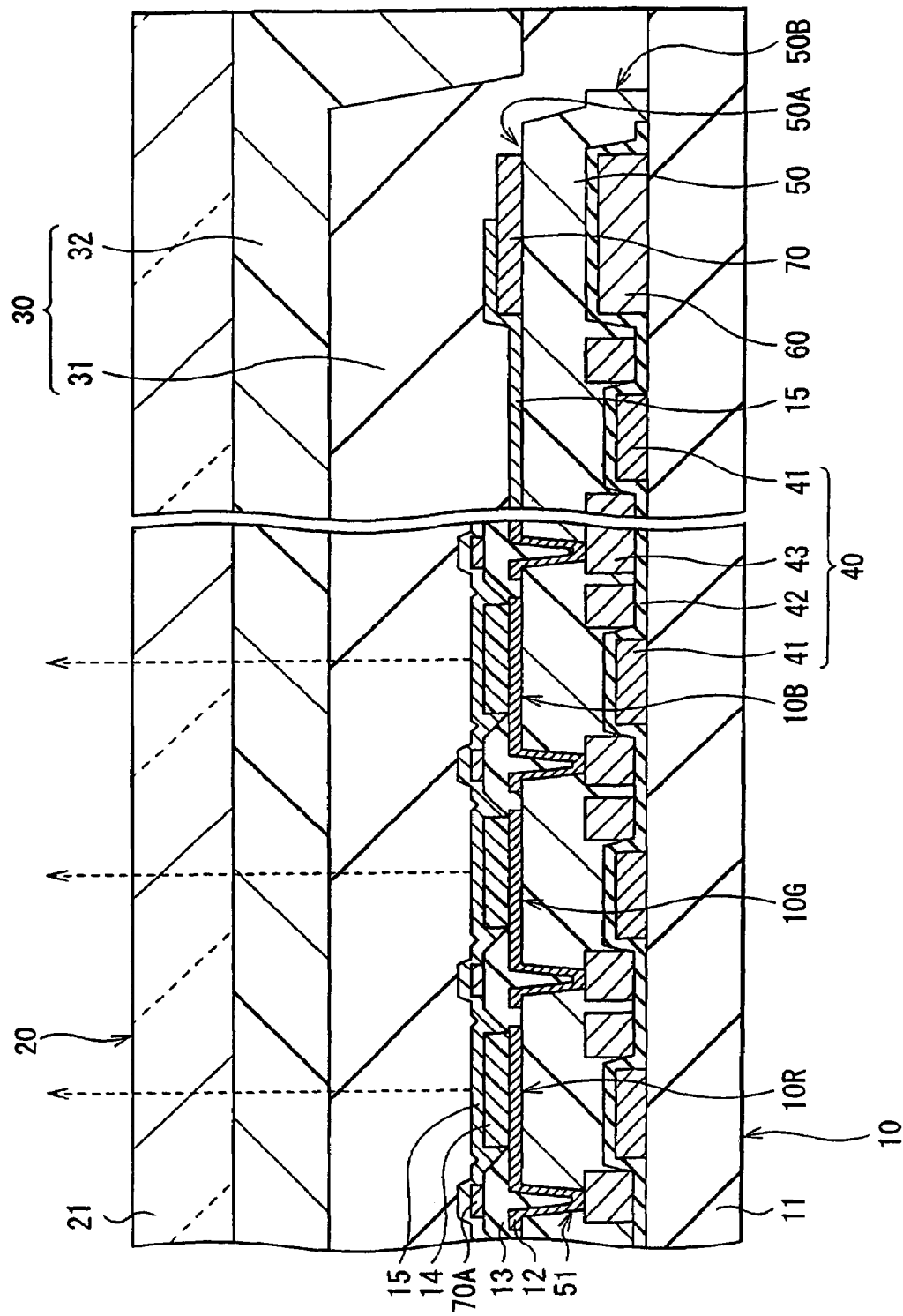
FIGS. 1A and 1B are sectional views of a display unit according to an embodiment of the present invention.

FIGS. 1A and 1B show sectional views of a display unit according to an embodiment of the invention. The display unit is used as an ultra-thin organic light-emitting display, for example, and in the display unit, a drive panel 10 and a sealing panel 20 face each other, and a middle layer 30 is disposed between the drive panel 10 and the sealing panel 20. In the drive panel 10, as shown in FIG. 1A, an organic light-emitting device 10R emitting red light, an organic light-emitting device 10G emitting green light and an organic light-emitting device 10B emitting blue light are arranged in order in a matrix on a drive substrate 11 made of an insulating material such as glass or the like with a drive device layer 40 and a coating layer 50 laid over the drive device layer 40 in between. Moreover, in a peripheral portion of the drive substrate 11, as shown in FIG. 1B, a peripheral circuit portion 60 and auxiliary electrode 70 are disposed.

The organic light-emitting devices 10R, 10G and 10B each include a first electrode 12 as an anode, an insulating layer 13, an organic layer 14 including a light-emitting layer, and a second electrode 15 as a cathode laminated in order from the drive substrate 11, for example. The second electrode 15 is formed as a common electrode which is laid all over the organic light-emitting devices 10R, 10G and 10B, and the second electrode 15 is electrically connected to a branch line 70A of the auxiliary electrode 70. Moreover, the second electrode 15 is extended to a peripheral portion of the drive substrate 11 so as to be electrically connected to the auxiliary electrode 70.

The first electrode 12 also functions as a reflective layer. The first electrode 12 is made of, for example, metal or an alloy thereof including platinum (Pt), gold (Au), chromium (Cr), tungsten (W), or the like.

The insulating layer 13 provides insulation between the first electrode 12 and the second electrode 15, and by the insulating layer 13, a light-emitting area in each of the organic light-emitting devices 10R, 10G and 10B is accurately formed in a desired shape. The insulating layer 13 is made of, for example, an insulating material such as silicon dioxide ($SiO_2$).

The organic layer 14 has a different structure depending upon light of a color emitted from the organic light-emitting device. The organic light-emitting devices 10R and 10B each have a structure in which a hole transport layer, a light-emitting layer and an electron transport layer are laminated in order from the first electrode 7.2, and the organic light-emitting device 10G has a structure in which a hole transport layer and a light-emitting layer are laminated in order from the first electrode 12. The hole transport layer is provided to improve hole injection efficiency into the light-emitting layer. The light-emitting layer emits light through recombining electrons and holes with the application of an electric field. The electron transport layer is provided to improve electron injection efficiency into the light-emitting layer.

In the organic light-emitting device 10R, as the material of the hole transport layer, for example, bis[(N-naphthyl)-N-phenyllbenzidine (NPD) or the like is used, and as the material of the light-emitting layer, for example, 2,5-bis[4-[N-(4-methoxyphenyl)-N-phenylamino]styrylbenzene-1,4-dicarbonitrile (BSB) or the like is used, and further, as the material of the electron transport layer, for example, a 8-quinolinol aluminum complex ($Alq_3$) or the like is used.

In the organic light-emitting device 10B, as the material of the hole transport layer, for example, NPD or the like is used, and as the material of the light-emitting layer, for example, 4,4'-bis(2,2'-diphenylvinyl)biphenyl (DPVBi) or the like is used, and as the material of the electron transport layer, for example, $Alq_3$ or the like is used.

In the organic light-emitting device 10B, as the material of the hole transport layer, for example, NPD or the like is used, and as the material of the light-emitting layer, for example, $Alq_3$ blended with 1% by volume of Coumarin6 (C6) is used.

The second electrode 15 is made of a semi-transparent electrode, and light generated in the light-emitting layer is extracted from the second electrode 15. The second electrode 15 is made of, for example, metal or an alloy thereof including silver (Ag), aluminum (Al), magnesium (Mg), calcium (Ca), sodium (Na) or the like.

The sealing panel 20 includes a sealing substrate 21, and the sealing substrate 21 is disposed on a side of the drive panel 10 where the organic light-emitting devices 10R, 10G and 10B are disposed to seal the organic light-emitting devices 10R, 10G and 10B together with the middle layer 30. The sealing substrate 21 is made of a material transparent to light generated in the organic light-emitting devices 10R, 10G and 10B, such as glass or the like. For example, the sealing substrate 21 includes a color filter and a reflective light absorption film (both not shown) to extract light generated in the organic light-emitting devices 10R, 10G and 10B and absorb extraneous light reflected by the organic light-emitting devices 10R, 10G and 10B and wiring in between, thereby resulting in improved contract.

The middle layer 30 is disposed between the drive panel 10 and the sealing panel 20 so as to be laid over the organic light-emitting devices 10R, 10G and 10B as well as a surface 50A and an end surface 50B of the coating layer 50. Thereby, in the display unit, the end surface 50B of the coating layer 50 is not exposed to outside from between the drive panel 10 and the sealing panel 20, so external moisture can be prevented from entering into the organic light-emitting devices 10R, 10G and 10B via the coating layer 50.

For example, the middle layer 30 preferably includes a protective film 31 which is laid over the organic light-emitting devices 10R, 10G and 10B and the surface 50A and the end surface 50B of the coating layer 50, and an adhesive layer 32 disposed between the protective film 31 and the sealing substrate 21. The protective film 31 protects the organic light-emitting devices 10R, 10G and 10B from degradation thereof, and is made of, for example, a transparent dielectric such as silicon oxide (SiO2), silicon nitride (SiN) or the like. The adhesive layer 32 is made of, for example, a thermosetting resin or the like, and bonds the whole surfaces of the drive panel 10 and the protective film 31 and the whole surface of the sealing panel 20 together. Moreover, in a peripheral portion of the drive substrate 11, the adhesive layer 32 is preferably formed on the drive substrate 11 with the protective film 31 in between, because the protective film 31 has better adhesion to the adhesive layer 32 than to the drive substrate 11 made of glass or the like.

The drive device layer 40 includes a TFT 41 as a drive device for driving the organic light-emitting devices 10R, 10G and 10B. A gate electrode (not shown) of the TFT 41 is connected to a scanning circuit (not shown), and a source and a drain (both not shown) are connected to wiring 43 disposed through an interlayer insulating film 42 made of, for example, silicon oxide, PSG (Phospho-Silicate Glass) or the like. The wiring 43 is connected to the source and the drain of the TFT 41 through a connecting hole (not shown) disposed in the interlayer insulating film 42 so as to be used as a signal line. The wiring 43 is made of, for example, aluminum (Al), an aluminum (Al)-copper (Cu) alloy or the like. The TFT 41 may have any structure such as a bottom gate structure or a top gate structure.

The coating layer 50 is disposed so as to be laid over the drive device layer 40 and the peripheral circuit portion 60, thereby the coating layer 50 protects the drive device layer 40 and the peripheral circuit portion 60 in manufacturing steps of the organic light-emitting devices 10R, 10G and 10B. Moreover, the coating layer 50 also has a function as a planarization layer which planarizes the surface of the drive substrate 11 on which the drive device layer 40 is formed so as to prevent the occurrence of a defect in the organic light-emitting devices 10R, 10G and 10B. In the coating layer 50, a connecting hole 51 is disposed to connect the first electrode 12 of each of the organic light-emitting devices 10R, 10G and 10B to the wiring 43.

The coating layer 50 is preferably made of a material with high pattern accuracy, because in the coating layer 50, a minute connecting hole 51 is formed. Moreover, as the organic light-emitting devices 10R, 10G and 10B are formed on the coating layer 50, the coating layer 50 is more preferably made of a material with low moisture absorption in order to prevent degradation of the organic light-emitting devices 10R, 10G and 10B. The moisture absorption is preferably approximately 1% or less under specified measuring conditions, for example. More specifically, the coating layer 50 is made of, for example, an organic material such as a polyimide or the like.

The auxiliary electrode 70 and the branch line 70A prevent a voltage drop in the second electrode 15, and are made of, for example, a single layer or a laminate of an electrically conductive material with low resistance such as aluminum (Al), chromium (Cr) or the like. For example, the auxiliary electrode 70 is formed in a peripheral portion of the drive substrate 11 so as to surround an area where the organic light-emitting devices 10R, 10G and 10B are formed. The branch line 70A is formed on the insulating layer 13 in a matrix, anal is connected to the auxiliary electrode 70. The thickness and the width of the auxiliary electrode 70 can be larger than those of the branch line 70A.

The auxiliary electrode 70 may be formed on the coating layer 50 as shown in FIGS. 1A and 1B, or may be formed on the drive substrate 11 and be connected to the second electrode 15 through a contact hole. When the auxiliary electrode 70 is formed on the drive substrate 11, the coating layer 50 is preferably formed so as to be laid over the auxiliary electrode 70, because the coating layer 50 can protect the auxiliary electrode 70.

Figure 2:
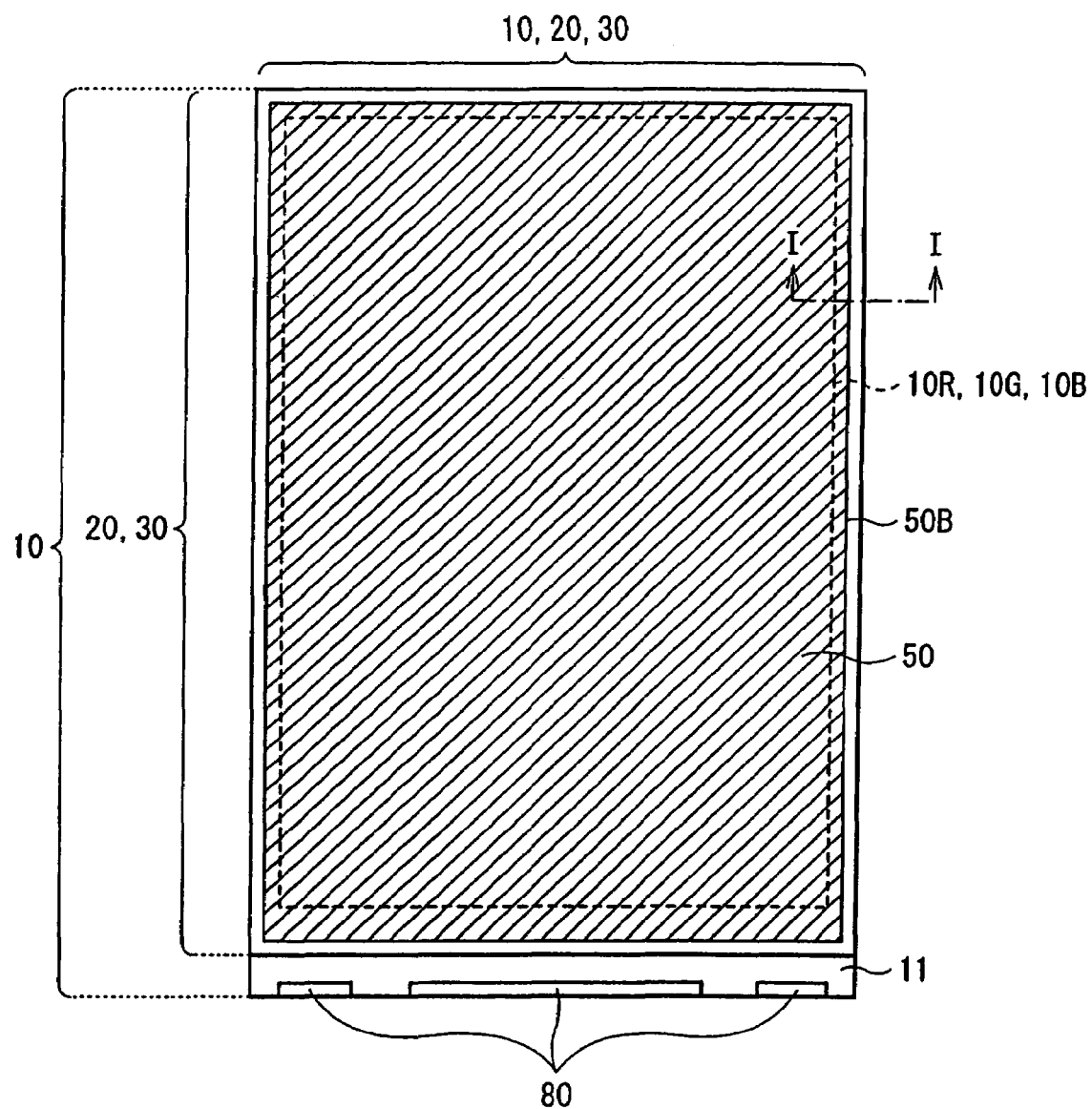
FIG. 2 is a plan view showing a positional relationship of a drive panel, a sealing panel, a middle layer and a coating layer shown in FIGS. 1A and 1B according to an embodiment of the present invention.

FIG. 2 shows a two-dimensional positional relationship of the drive panel 10, the sealing panel 20, the middle layer 30 and the coating layer 50. The drive panel 10 and the sealing panel 20 do not necessarily have the same size. For example, a portion of the drive substrate 11 is not coated with the sealing panel 20 and the middle layer 30, so the portion of the drive substrate 11 is exposed. A terminal portion 80 made of, for example, a titanium (Ti)-aluminum (Al) alloy or the like is disposed in the exposed portion.

As shown in FIG. 2, the middle layer 30 is formed all over the sealing panel 20. Moreover, the forming range of the coating layer 50 is an area (a diagonally shaded area in FIG. 2) in an area where the middle layer 30 is formed.

In the display unit, for example, when a predetermined voltage is applied between the first electrode 12 and the second electrode 15, current is injected into the light-emitting layer of the organic layer 14 to recombine holes and electrons, thereby light is emitted. The light is extracted from the sealing panel 20. Herein, not only the surface 50A but also the end surface 50B of the coating layer 50 are covered with the middle layer 30, that is, the protective film 31 and the adhesive layer 32. Therefore, the end surface 50B of the coating layer 50 is not exposed to outside from between the drive panel 10 and the sealing panel 20, so external moisture can be prevented from entering inside via the coating layer 50, thereby degradation of the organic light-emitting devices 10R, 10G and 10B can be prevented.

The display unit can be manufactured through the following steps, for example, according to an embodiment of the present invention.

FIGS. 3A and 3B through FIGS. 6A and 6B show steps of a method of manufacturing the display unit in order. At first, as shown in FIGS. 3A and 3B, for example, the drive device layer 40 including the TFT 41, the interlayer insulating film 42 and the wiring 43 and the peripheral circuit portion 60 are formed on the drive substrate 11 made of the above-described material.

Figures 4A, 4B:
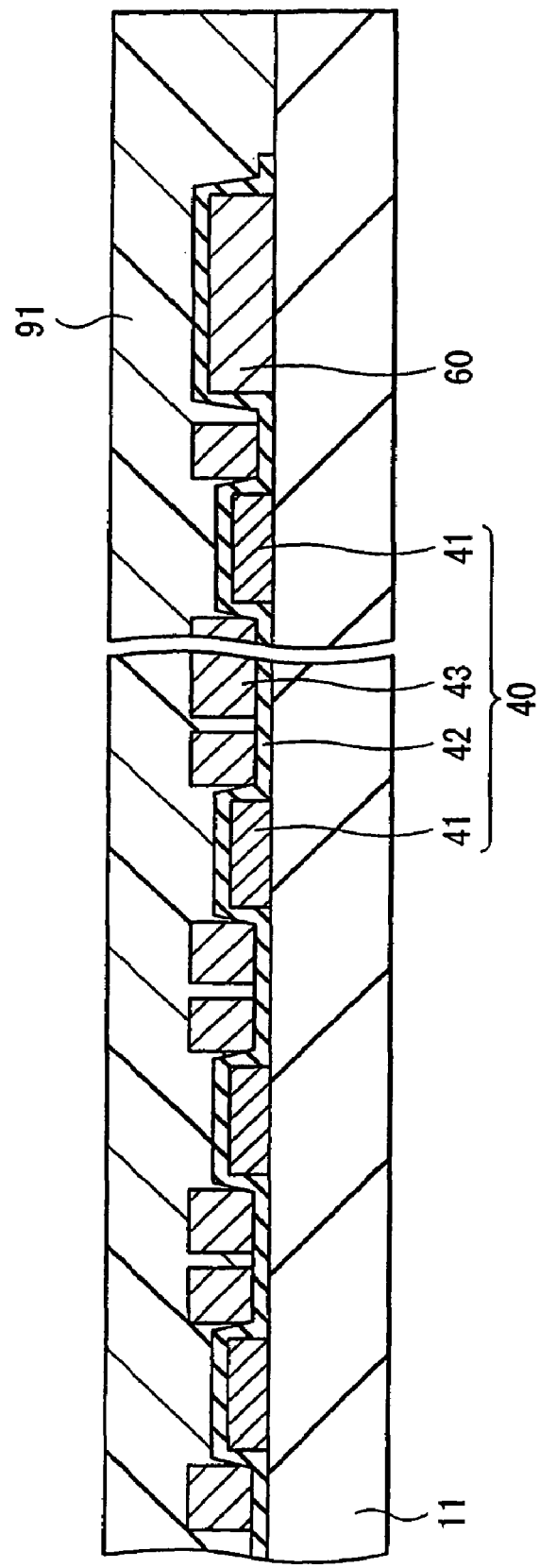
FIGS. 4A and 4B are illustrations for describing a step following the step of FIGS. 3A and 3B according to an embodiment of the present invention.

Next, as shown in FIGS. 4A and 4B, a photosensitive film 91 made of a material with photosensitivity is formed all over the drive substrate 17. As the material of the photosensitive film 91, the material described above as the material of the coating layer 50 can be used.

Figures 5A, 5B:
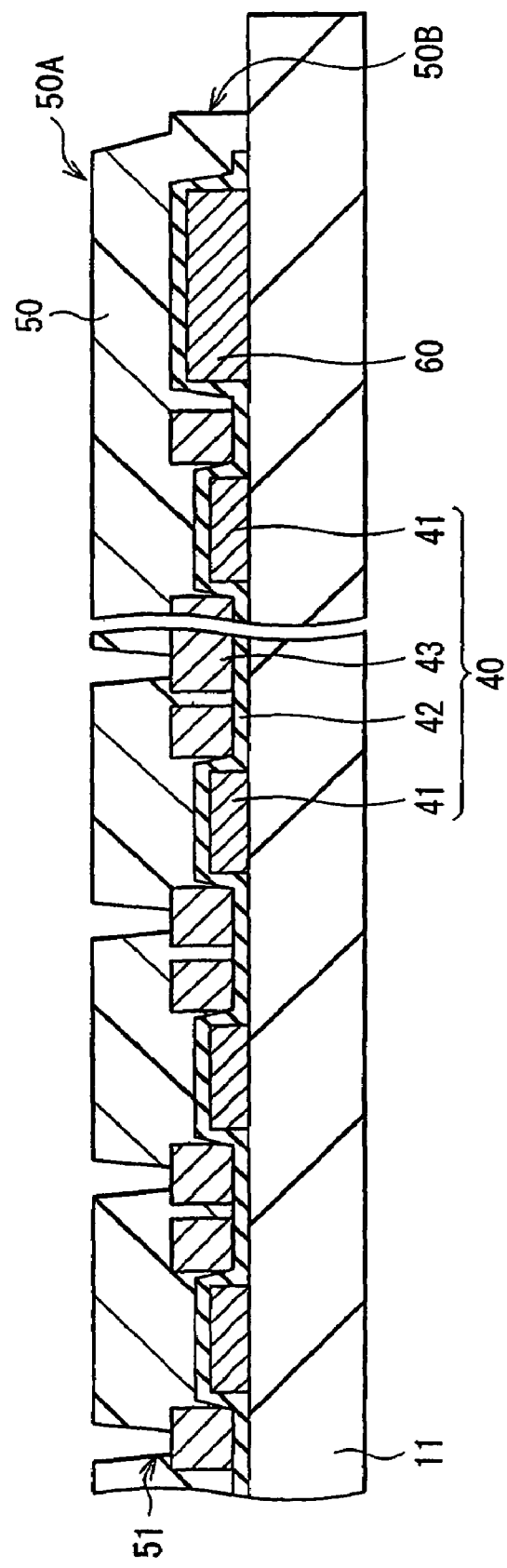
FIGS. 5A and 5B are illustrations for describing a step following the step of FIGS. 4A and 4B according to an embodiment of the present invention.

Then, as shown in FIGS. 5A and 5B, the photosensitive film 91 is exposed and developed so as to form the coating layer 50 which is laid over the drive device layer 40 and the peripheral circuit portion 60. At the same time, the connecting hole 51 can be formed.

Figures 6A, 6B:
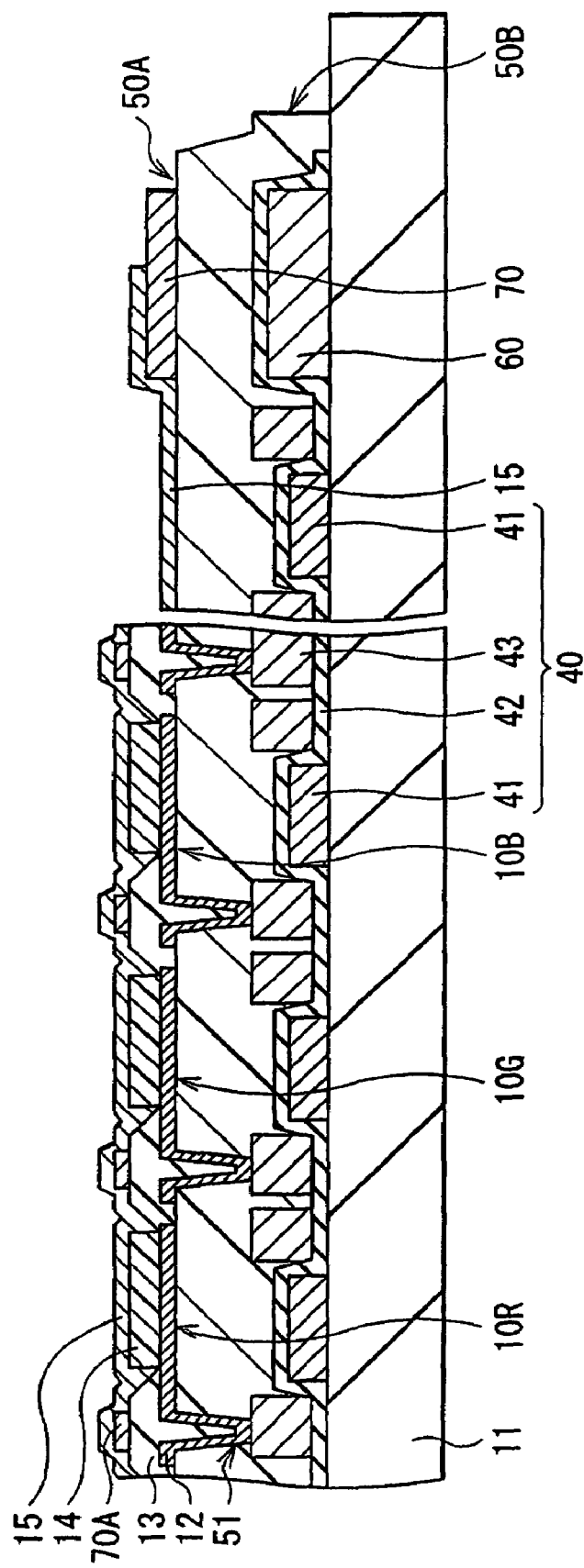
FIGS. 6A and 6B are illustrations for describing a step following the step of FIGS. 5A and 5B according to an embodiment of the present invention.

After that, as shown in FIGS. 6A and 6B, the organic light-emitting devices 10R, 10G and 10B and the terminal portion 80 (refer to FIG. 2) are formed. More specifically, at first, the first electrode 12 made of the above-described material is formed corresponding to the connecting hole 51 of the coating layer 50 to electrically connect the drive device layer 40 to the first electrode 12. Next, on the first electrode 12, the insulating layer 13 is formed in a predetermined pattern. Then, on the insulating layer 13, the branch line 70A of the auxiliary electrode 70 is formed, and the auxiliary electrode 70 is formed in a peripheral portion of the drive substrate 11. Next, the hole injection layer, the hole transport layer, the light-emitting layer and the electron transport layer each of which is made of the above-described material are formed in order to form the organic layer 14, then the second electrode 15 made of the above-described material is formed.

Figures 7A, 7B:
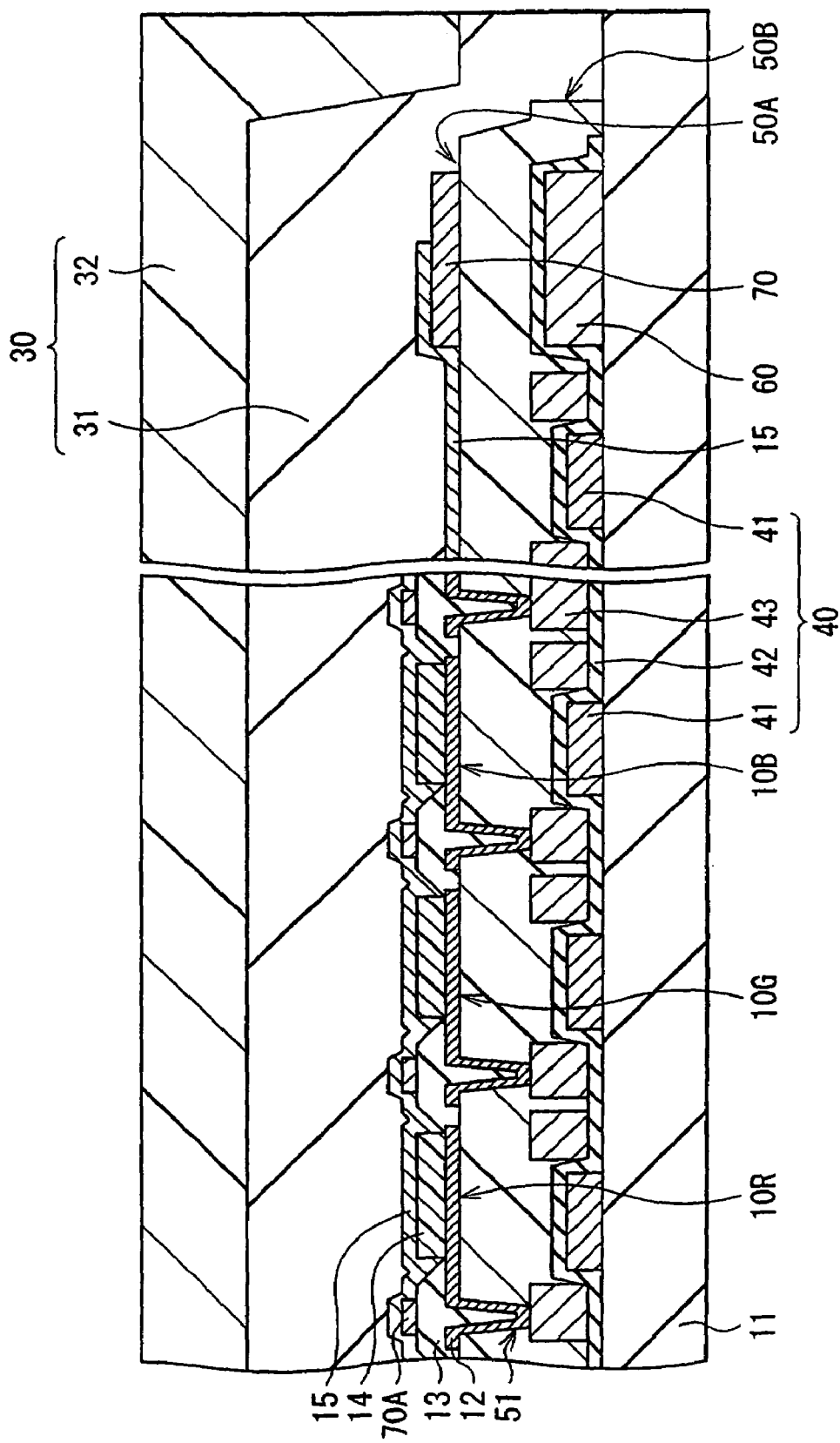
FIGS. 7A and 7B are illustrations for describing a step following the step of FIGS. 6A and 6B according to an embodiment of the present invention.

After the organic light-emitting devices 10R, 10G and 10B are formed, as shown in FIGS. 7A and 7B, the protective film 31 is formed so as to be laid over the organic light-emitting devices 10R, 10G and 10B and the surface 50A and the end surface 50B of the coating layer 50, and then the adhesive layer 32 made of the above-described material is formed. Thereby, the middle layer 30 is formed.

Next, the sealing panel 20 made of the above-described material, and including the sealing substrate 21 on which a color filter is formed if necessary is prepared, and then the whole surfaces of the drive panel 10 and the protective film 31 and the whole surface of the sealing panel 20 are bonded together with the adhesive layer 32 in between. Finally, the display unit shown in FIGS. 1A, 1B and 2 is completed.

The display unit can be also manufactured through the following steps, for example, according to an embodiment of the present invention.

At first, by the step shown in FIGS. 3A and 3B, the drive device layer 40 and the peripheral circuit portion 60 are formed on the drive substrate 11.

Figures 9A, 9B:
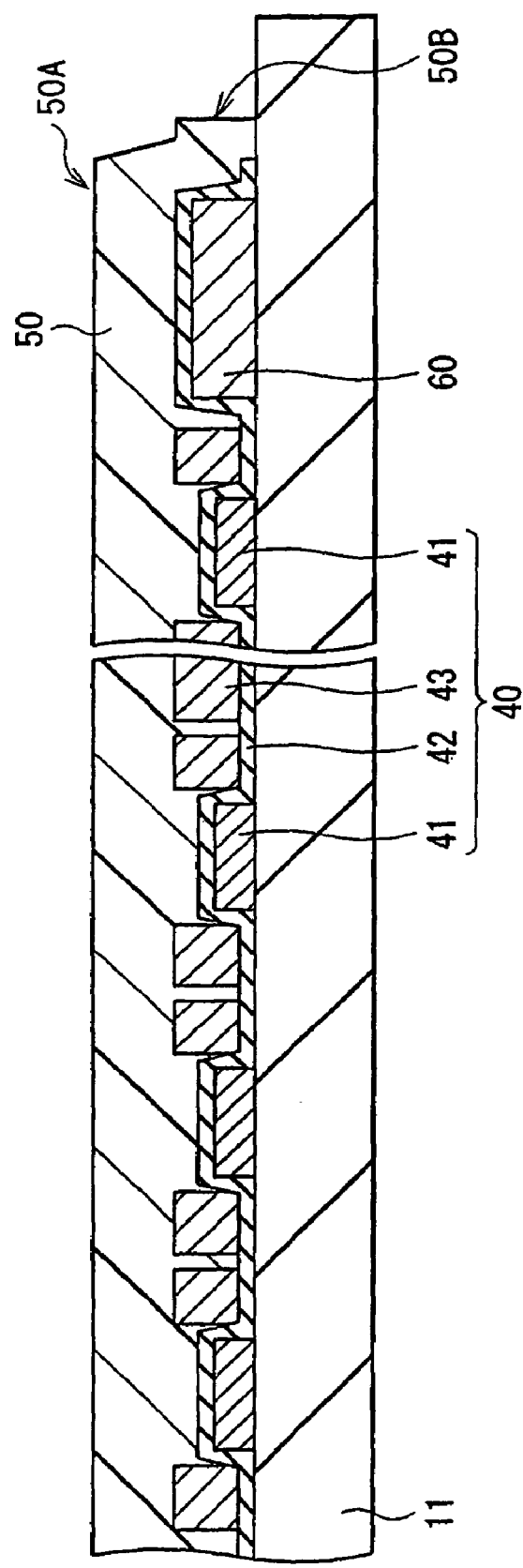
FIGS. 9A and 9B are illustrations for describing a step following the step of FIGS. 8A and 8B according to an embodiment of the present invention.

Next, as shown in FIGS. 8A and 8B, a sheet-shaped polarization film 92 with the same size as that of the area where the coating layer 50 is formed (that is, the diagonally shaded area in FIG. 2) is prepared. The sheet-shaped polarization film 92 is disposed in a predetermined position on the drive substrate 11 on which the drive device layer 40 and the peripheral circuit portion 60 is formed. Thereby, as shown ire FIGS. 9A and 9B, the coating layer 50 is formed.

Next, by the step shown in FIGS. 5A and 5B, the connecting hole 51 is formed in the coating layer 50. After that, by the step shown in FIG. 6A and 6B, the organic light-emitting devices 10R, 10G and 10B and the terminal portion 80 are formed. Then, by the step shown in FIGS. 7A and 7B, the protective film 31 and the adhesive layer 32 are formed in order, and then the whole surfaces of the drive panel 10 and the protective film 31 and the whole surface of the sealing panel 20 are bonded together with the adhesive layer 32 in between. Thereby, the display unit shown in FIGS. 1A, 1B and 2 is completed.

In the above described embodiment, the middle layer 30 between the drive panel 10 and the sealing panel 20 is laid over not only the organic light-emitting devices 10R, 10G and 10B and the surface 50A of the coating layer 50 but also the end surface 50B of the coating layer 60, so the end surface 60B of the coating layer 50 is not exposed to outside from between the drive panel 10 and the sealing panel 20. Therefore, external moisture can be prevented from entering inside via the coating layer 60, and degradation of the organic light-emitting devices 10R, 10G and 10B can be prevented. Thereby, the reliability of the display unit can be improved.

More specifically, in the embodiment, the organic light-emitting devices 10R, 10G and 10B and the surface 50A and the end surface 50B of the coating layer 50 are covered with the protective film 31, and the adhesive layer 32 is disposed between the protective film 31 and the sealing substrate 21, so the degradation of the organic light-emitting devices 10R, 10G and 10B can be effectively prevented by the protective film 31 and the adhesive layer 32. Therefore, sealing ability can be improved, and specifically, it is suitable for a display unit with the all-solid-state sealing structure in which the whole surfaces of the drive panel 10 and the sealing panel 20 are bonded together with the adhesive layer 32 in between.

Figures 10A, 10B:
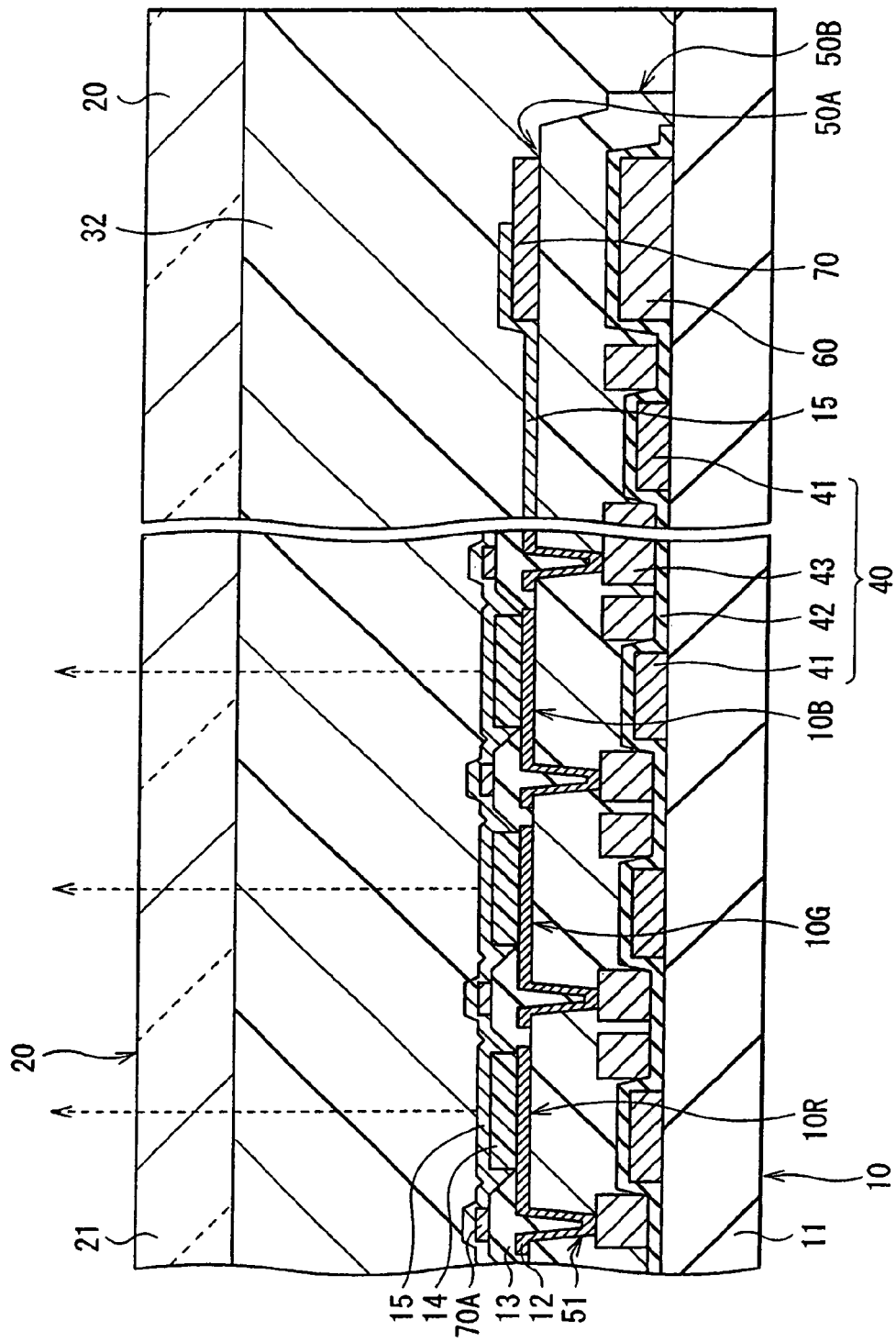
FIGS. 10A and 10B are sectional views of a modification of the display unit shown in FIGS. 1A and 1B according to an embodiment of the present invention.

In the embodiment, the case where the middle layer 30 includes the protective film 31 and the adhesive layer 32 is described; however, the protective film 31 is not necessarily included. For example, as shown in FIGS. 10A and 10B, the middle layer 30 may not include the protective film 31, and include only the adhesive layer 32.

Figure 11:
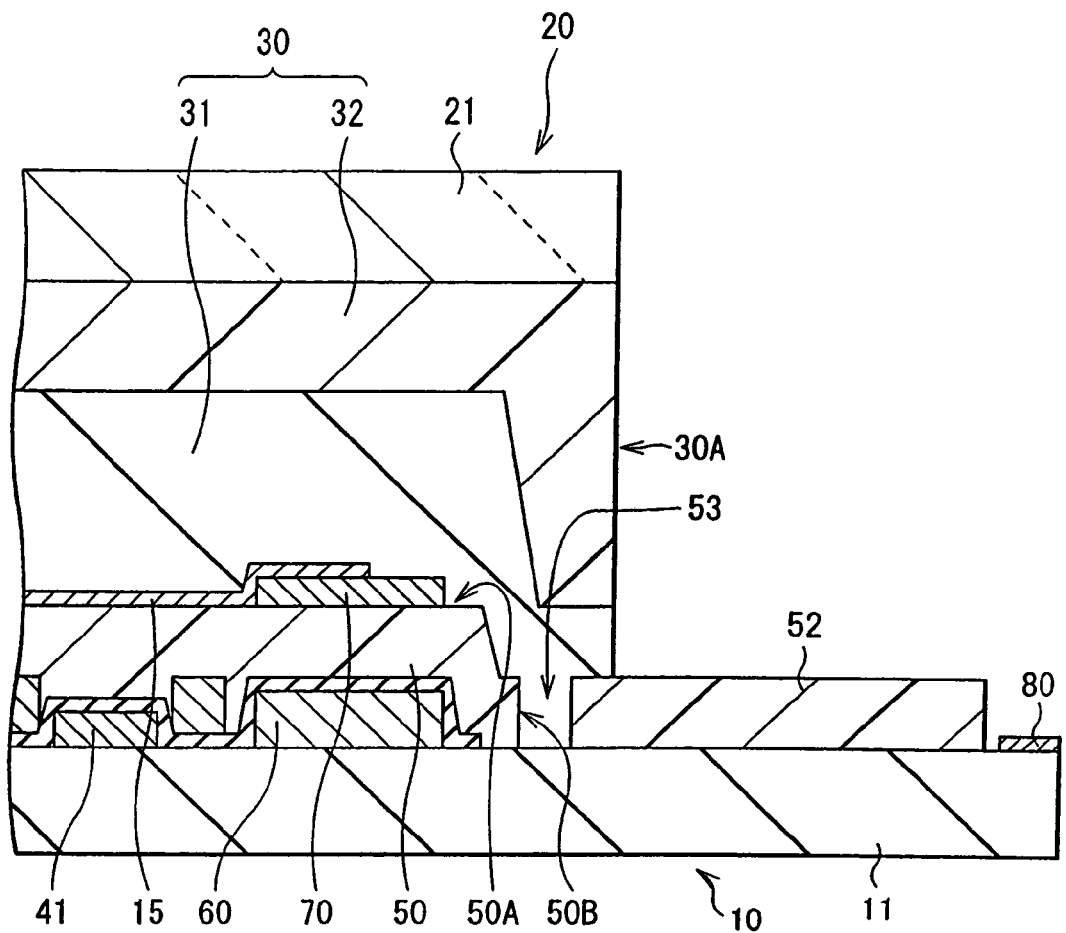
FIG. 11 is a sectional view of a modification of the display unit shown in FIGS. 1A and 1B according to an embodiment of the present invention.
Figure 12:
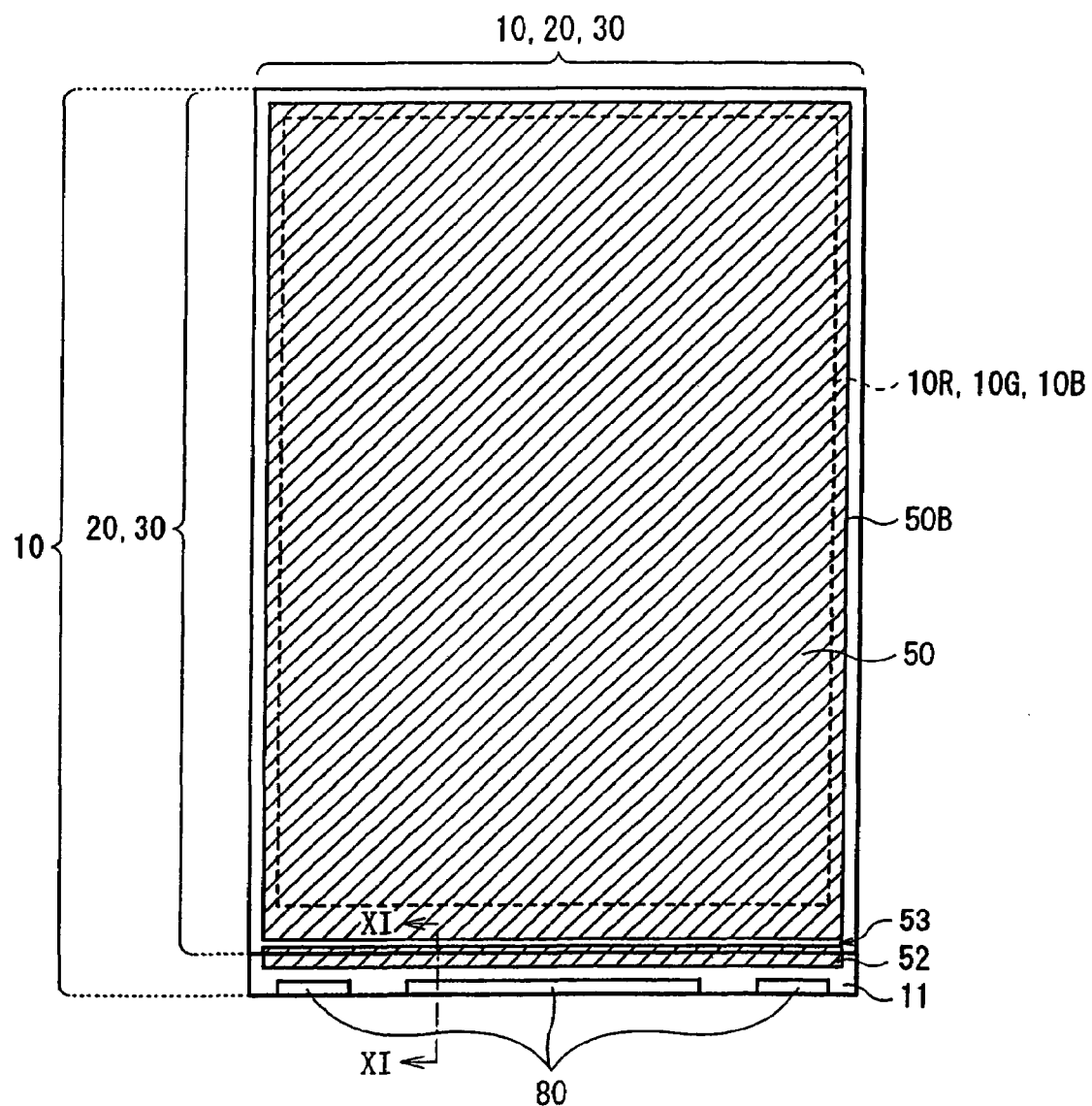
FIG. 12 is a plan view showing a positional relationship of a drive panel, a sealing panel, a middle layer and a coating layer shown in FIG. 11 according to an embodiment of the present invention.

FIG. 11 shows a sectional view of a display unit according to a modification of the above-described embodiment. In the display unit, as in the case of the above-described embodiment, the middle layer 30 is disposed between the drive panel 10 and the sealing panel 20, and not only the surface 50A but also the end surface 50B of the coating layer 50 are covered with the middle layer 30. Therefore, like components are denoted by like numerals as of the embodiment.

The coating layer 50 includes a portion 52 protruded from an end surface 30A of the middle layer 30, and the protruded portion 52 and the other portion of the coating layer 50 are separated by a separating groove 53. Thereby, in the display unit, external moisture can be prevented from entering inside via the protruded portion 52, and degradation of the organic light-emitting devices 10R, 10G and 10B can be prevented.

The display unit can be manufactured as in the case of the embodiment. Moreover, actions of the display unit are the same as according to the embodiment of the present invention.

Thus, in an embodiment, the coating layer 50 includes the portion 52 protruded from the end surface 30A and the middle layer 30, and the protruded portion 52 and the other portion of the coating layer 50 are separated by the separating groove 53, so external moisture can be prevented from entering inside via the protruded portion 52, and degradation of the organic light-emitting devices 10R, 10G and 10B can be prevented.

The invention is described referring to the embodiment, but the invention is not limited to the embodiment, and is modified in any suitable manner. For example, the material and the thickness of each layer, a film forming method and a film forming condition are not limited to those described in the above embodiment, and any other material, any other thickness, any other method and any other condition are applicable. For example, in the above-described embodiment, the case where the first electrode 12, the insulating layer 13, the organic layer 14 and the second electrode 15 are laminated in order on the drive substrate 11 to extract light from the sealing panel 20 is described, but the second electrode 15, the organic layer 14 and the first electrode 12 can be laminated in order on the drive substrate 11 to extract light from the drive substrate 11.

Further, for example, in an embodiment, the case where the first electrode 12 is the anode, and the second electrode 15 is the cathode is described, but the first electrode 12 may be a cathode, and the second electrode 15 may be an anode. Further, while the first electrode 12 is the cathode and the second electrode 15 is the anode, the second electrode 15, the organic layer 14 and the first electrode 12 can be laminated in order on the drive substrate 11 to extract light from the drive substrate 11.

In addition, in the embodiment, the structures of the organic light-emitting devices 10R, 10G and 10B are described in detail, but all layers are not necessarily required, or another layer may be further included.

Still further, in an embodiment, the case where the second electrode 15 is made of the semi-transparent reflective layer, includes the auxiliary electrode 70 and the branch line 70A for preventing a voltage drop in the second electrode 15 is described; however, the second electrode 15 may have a structure in which a semi-transparent reflective layer and a transparent electrode are laminated in order from the first electrode 12. The transparent electrode is provided to reduce electrical resistance of the semi-transparent reflective layer, and is made of an electrically conductive material with sufficient translucency to light generated in the light emitting layer. As the material of the transparent electrode, for example, ITO, or a compound including indium, zinc (Zn) and oxygen is preferable or the like, because high conductivity can be obtained even if film formation is carried out at groom temperature.

In addition, in an embodiment, the case where the whole surfaces of the drive panel 10 and the protective film 31 and the whole surface of the sealing panel 20 are bonded together with the adhesive layer 32 in between is described; however, the invention is applicable to the case where the adhesive layer 32 is formed only in a portion between the drive panel 10 and the sealing panel 20, such as the case where the adhesive layer 32 is formed only in an edge portion of the drive panel 10 to adhere to a metal can or the like.

In the display unit and the method of manufacturing a display unit according to an embodiment of the present invention, the middle layer between the drive panel and the sealing panel is laid over not only the surface but also the end surface of the coating layer, so the end surface of the coating layer is not exposed to outside from between the drive panel and the sealing panel, thereby external moisture can be prevented from entering a device portion in the display unit via the coating layer. Therefore, degradation of the devices can be prevented, and the reliability of the display unit can be improved.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method of manufacturing a display unit, comprising:
    forming a plurality of light-emitting devices on a drive substrate with a drive device layer and a coating layer that is formed on the drive device layer in between to form a drive panel;
    forming a middle layer being laid over the plurality of light-emitting devices and a surface and an end surface of the coating layer; and
    disposing a sealing panel including a sealing substrate on a side of the drive panel where the light-emitting devices are disposed so as to face the drive panel with the middle layer in between, wherein the middle layer includes an adhesive layer for bonding the whole surfaces of the drive panel and the sealing panel together.

2. The method of manufacturing a display unit according to claim 1, wherein the coating layer is formed by disposing a sheet-shaped coating film.

3. The method of manufacturing a display unit according to claim 1, wherein subsequent to forming a photosensitive film that includes a photosensitive material, the photosensitive film is exposed and developed so as to form the coating layer.

4. The method of manufacturing a display unit according to claim 1, wherein similar to the middle layer, a protective film being laid over the plurality of light-emitting devices and the end surface of the coating layer, and an adhesive layer are formed in order, then the whole surfaces of the drive panel and the protective film and the whole surface of the sealing panel are bonded together with an adhesive layer in between.

5. The method of manufacturing a display unit according to claim 1, wherein
    the light-emitting devices are organic light-emitting devices each having a laminate including a first electrode, an organic layer including a light-emitting layer, and a second electrode in order from the drive substrate so as to extract light generated in the light-emitting layer from the second electrode.

* * * * *